United States Patent [19]

Colinge

[11] Patent Number: 4,857,476
[45] Date of Patent: Aug. 15, 1989

[54] BIPOLAR TRANSISTOR PROCESS USING SIDEWALL SPACER FOR ALIGNING BASE INSERT

[75] Inventor: Jean-Pierre Colinge, Palo Alto, Calif.

[73] Assignee: Hewlett-Packard Company, Palo Alto, Calif.

[21] Appl. No.: 148,419

[22] Filed: Jan. 26, 1988

[51] Int. Cl.⁴ .......................................... H01L 21/265
[52] U.S. Cl. ........................................ 437/33; 437/31; 437/228; 437/233; 437/200; 437/162; 148/DIG. 10; 148/DIG. 11
[58] Field of Search ............... 437/31, 32, 33, 200, 437/233, 241, 228, 193, 186, 162, 238; 148/DIG. 10, DIG. 11; 357/34, 59 H; 156/643, 653, 657

[56] References Cited

U.S. PATENT DOCUMENTS

| | | | |
|---|---|---|---|
| 4,398,962 | 8/1983 | Kanazawa | 437/33 |
| 4,418,469 | 12/1983 | Fujita | 357/59 H |
| 4,662,062 | 5/1987 | Toyooka | 148/DIG. 10 |
| 4,682,409 | 7/1987 | Thomas | 437/200 |
| 4,705,599 | 11/1987 | Suda | 437/33 |
| 4,745,080 | 5/1988 | Scovell | 437/31 |
| 4,749,661 | 6/1988 | Bower | 437/33 |
| 4,778,774 | 10/1988 | Blossfeld | 148/DIG. 11 |
| 4,784,971 | 11/1988 | Chiu | 437/33 |

OTHER PUBLICATIONS

Dockerty, R., IBM TDB vol. 25, No. 11B, Apr. 1983, pp. 6150-6151.

*Primary Examiner*—Brian E. Hearn
*Assistant Examiner*—Kevin McAndrews

[57] ABSTRACT

An improved method for fabricating a bipolar transistor reduces base current resistance which heretofore has limited the switching frequency and current handling ability of bipolar transistors. The transistor base and emitter are formed as a diffusion through an emitter contact pedestal formed on an epitaxial layer over a substrate. Access to the n-type emitter is through the emitter contact pedestal while access to the lightly doped p-type base is through a nearby heavily doped p-type base insert. Electrical isolation between the pedestal and the base insert is ensured by forming oxide sidewall spacers on the emitter contact pedestal during the implant used to form the base insert. Defining the isolation with sidewall spacers permits reliable isolation of emitter and base insert while minimizing their physical separation. The minimized physical separation provides a base current path with considerably less total resistance than is found in the background art in which the isolation is defined photo-lithographically.

4 Claims, 7 Drawing Sheets

BIPOLAR TRANSISTOR PROCESS USING SIDEWALL SPACER FOR ALIGNING BASE INSERT

BACKGROUND OF THE INVENTION

The present invention relates to bipolar transistor fabrication and, more particularly, to a method in a fabrication process of aligning a base insert with an emitter. A major object of the present invention is to provide a bipolar transistor with faster switching speeds for high frequency operation.

Progress in integrated circuit technology has been measured largely in terms of increasing speed and decreasing feature sizes. While bipolar technology has provided some of the fastest circuit elements available, there is still need for bipolar transistors capable of handling higher switching frequencies. A related goal is greater current handling, since higher currents are needed to overcome parasistic capacitances that impede circuit operation at high frequencies.

Base resistance is a significant impediment to high frequency operation since it dulls switching transitions and requires additional power for equivalent collector currents. Base resistance resides primarily in a lightly doped intermediate region between a highly doped base insert and a current path from an emitter to a collector. Some base resistance is required to limit base-emitter leakage currents. The length of the intermediate region which must be traversed by a base current is determined largely by the width of an oxide isolation which is used during processing to ensure physical and electrical isolation of emitter and base insert.

Figure 1:
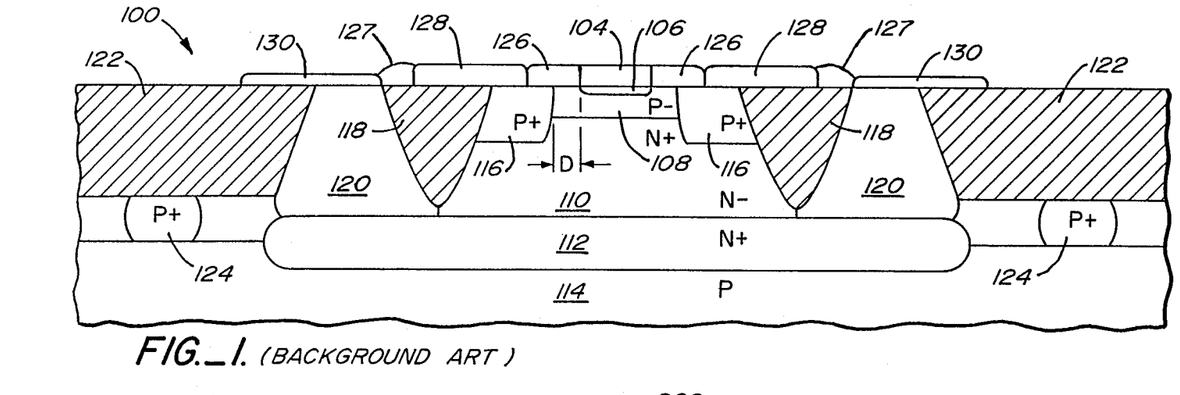
FIG. 1 is a sectional view of a bipolar transistor fabricated in accordance with a process of the background art.

A bipolar transistor 100 having such an oxide isolation 126 is shown in FIG. 1. This bipolar transistor is of the npn type, including an n-type emitter 106, an n-type collector 112, and a p-type base 108. Electrical access to the base is through a base insert 116 of heavily doped p-typed material. This base insert must be electrically isolated from the emitter to avoid shorting.

The location of the emitter is defined by an emitter contact pedestal 104 through which an emitter diffusion is made during processing and through which an emitter flows during operation. The emitter contact pedestal is photo-lithographically defined along with a base contact 128 and a collector contact 130 in a polysilicon layer. Heating this structure in an oxygen environment causes an oxide isolation 126 to form locally between the emitter contact pedestal and the base contact and another oxide isolation 127 to form between the base contact and the collector contact. The base insert is introduced with the oxide isolation serving as a mask so that, even after diffusion of the base insert dopant, the emitter and the base insert remain isolated.

In operation, an emitter current can flow vertically downward from the emitter to the collector through the base and a collector drift region 110. The base current must flow at least a distance D through the lightly doped base toward the emitter current path to induce the emitter current. Since the path between the base insert and the emitter current path lies through lightly doped material, significant resistance is encountered. While lateral diffusion allows the distance D to be less than the width of the isolation oxide, there is a practical limit to which distance D can be reduced by extended diffusion. Accordingly, resistive distance D is bounded from below as a function of the width of the isolation oxide, which is in turn bounded from below by the resolution of the photo-lithographic process used to define the aperture in which the isolation oxide 126 is formed.

The present invention is directed toward reducing the distance through which base current must traverse between a base insert and an emitter current path so that the resistance encountered by the base current is reduced. The reduction of this distance permits faster switching speeds, greater current gain, and an overall decrease in device size. Thus the present invention promotes advances along several key parameters of interest in integrated circuit technology.

SUMMARY OF THE INVENTION

In the present invention, a sidewall spacer is formed on an emitter contact pedestal. This sidewall spacer serves as a self-aligned mask for the introduction of the dopant for the base insert. The lower bound for the width of the sidewall spacer is limited by thin film tolerances rather than photo-lithographic resolution. The use of the sidewall spacers permits reliable isolation of base insert and emitter while reducing the length of the resistive path for the base current by about 80% relative to the path length achievable using photo-lithographically defined oxide isolation.

The base of the bipolar transistor can be formed concurrent with the base inserts or subsequently. For concurrent base formation, the dopant used to instill the conductivity of the base is concurrently implanted in the emitter contact pedestal and diffused from there into the base region. The concentration of dopant in the base region can be controlled according to the thickness of a material covering the emitter contact pedestal. A later doping step is used to form an emitter within the base region. For subsequent formation of the base, dopants of opposing conductivity can be introduced in a later step into the emitter contacted pedestal. Differential diffusion rate then can be used to define separate base and emitter.

The use of sidewall spacer, instead of a photo-lithographically defined isolation oxide, to define the isolation between emitter and base provides for a smaller transistor overall. The smaller transistor then permits a circuit designer to obtain greater functionality per unit area. The concomitant reduction in resistive base current path length minimizes resistance encountered by the base current. This in turn increases frequency and current handling ability of the transistor. Other features and advantages of the present invention are apparent in view of the description below with reference to the following drawings.

BRIEF DESCRIPTION OF THE DRAWINGS

Generally, herein, the first digit of a three digit reference number indicates the figure number with respect to which the element referred to is first introduced in the description below. In the figures, "n" and "p" refer respectively to negatively and positively doped semiconductor regions, while the asociated subscripts "+" and "−" respectively indicate heavy and light doping.

DESCRIPTION OF THE PREFERRED EMBODIMENTS

Figure 2:
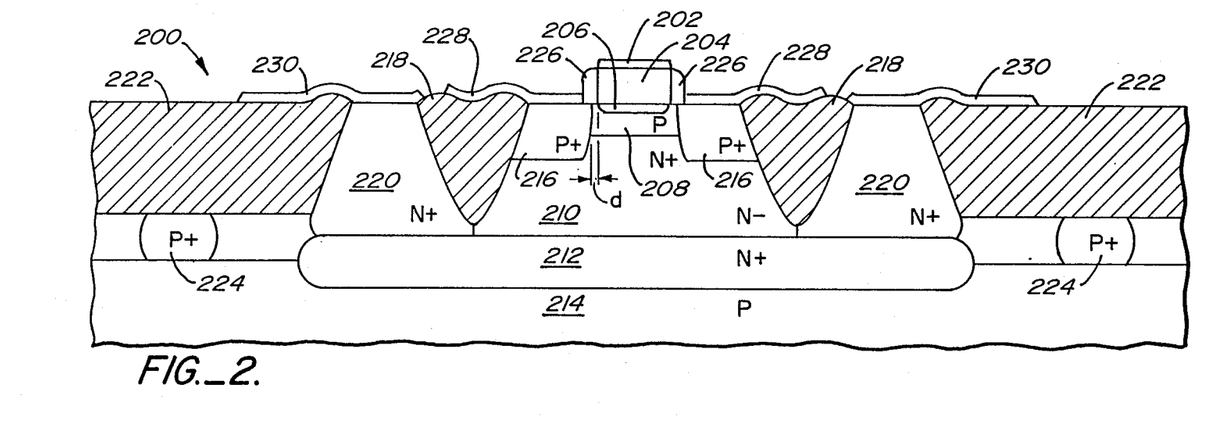
FIG. 2 is a sectional view of a bipolar transistor fabricated in accordance with the present invention.

A bipolar transistor 200 in accordance with the present invention is shown in FIG. 2. Moving from top to bottom along the center of FIG. 2, bipolar transistor 200 includes an emitter contact 202, a polycrystalline silicon emitter contact pedestal 204, an emitter 206, a base 208, a collector drift region 210, a collector 212 and a substrate 214. Moving radially outward from base 208, bipolar transistor 200 also includes a base insert 216, an inner field oxide 218, a collector insert 220, and an outer field oxide 222. Below outer field oxide 222 is a channel stop 224. To the sides of emitter contact pedestal 206 is a sidewall spacer 226. The remaining surface features are a base contact 228 and a collector contact 230.

When bipolar transistor 200 is on, a base current respectively traverses base contact 228, base insert 216, and base 208 where it merges with an emitter current. The emitter current path is generally downward from emitter 206, gradually dispersing toward collector 212. Transistor switching speed is constrained by the resistance encounter by the base current. The resistance is greatest in the lightly doped base 208 between the heavily doped base insert 216 and the emitter current path, which corresponds to the distance d between base insert 216 and emitter 206 as shown in FIG. 2.

Bipolar transistor 200 corresponds element-by-element with bipolar transistor 100 of the background art shown in FIG. 1. Moving from top to bottom along the center of FIG. 1, bopolar transistor 100 includes an emitter contact pedestal 104, an emitter 106, a base 108, a collector drift region 110, a collector 112 and a substrate 114. Moving radially outward from base 108, bipolar transistor 100 also includes a base insert 116, an inner field oxide 118, a collector insert 120, and an outer field oxide 122. Below outer field oxide 122 is a channel stop 124. The remaining surface features are a base contact 128 and a collector contact 130. However, instead of a sidewall spacer there is a much wider isolation oxide 126. Due to the greater width of this isolation oxide 126, the base current resistive path length D is significantly greater than the base current resistive path length d of bipolar transistor 200.

The fabrication of bipolar transistor 200 beings with a series of steps illustrated in FIGS. 3A-C and 4. Similar initial steps are used in the fabrication of background art bipolar transistor 100. Bipolar transistor 200 is fabricated on p-type substrate 214, shown in FIG. 3A, in the form of a silicon wafer. The surface of the substrate is oxidized to form a layer of silicon dioxide $SiO_2$ about 6500–7500 Å thick. The oxide is patterned using conventional semiconductor photo-lighography. In other words, a resist is applied over the oxide, the resist is exposed in the desired pattern, the exposed resist is removed to uncover some of the oxide, the uncovered oxide is etched off, and the remaining resist is chemically removed.

A heavy arsenic, or other n-type dopant such as antimony, implant penetrates substrate 214 except where the oxide layer remains. Prior to the arsenic implant, a very thin oxide layer, about 100 Å thick is grown over the exposed substrate surface to prevent contamination from the implanter from entering substrate 214. Heat is used to drive the arsenic to its ultimate location to define collector 212. Then both the thin and thick layers of oxide are stripped from substrate 214. Collector 212 is buried by an epitaxial layer 332 of silicon grown to a thickness of about 1.0 microns (μm). This epitaxial layer is lightly doped with n-type dopant to a resistivity of about 0.5 Ω·cm. These steps yield the structure of FIG. 3A in which collector 212 is formed as a heavily doped n-type buried layer between the p-type substrate 214 and lightly doped n-type epitaxial layer 332.

Figure 3A:
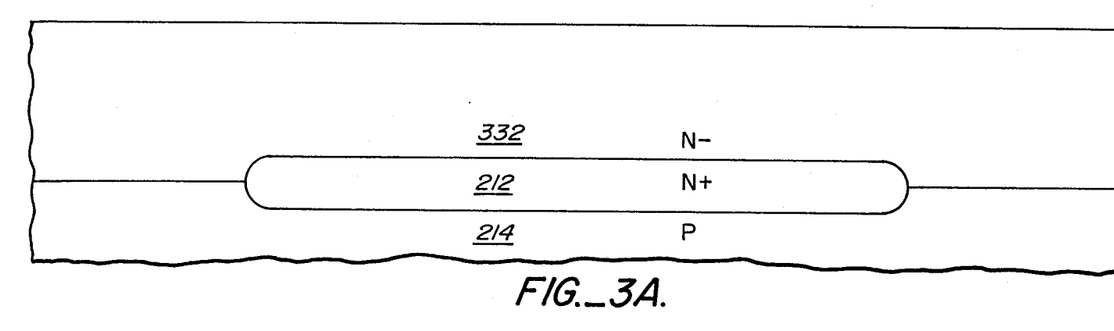
FIGS. 3A-C are sectional views of the bipolar transistor of FIG. 2 at successive stages of fabrication. These stages closely correspond to stages in the fabrication of the bipolar transistor of FIG. 1 as well.
Figure 3B:
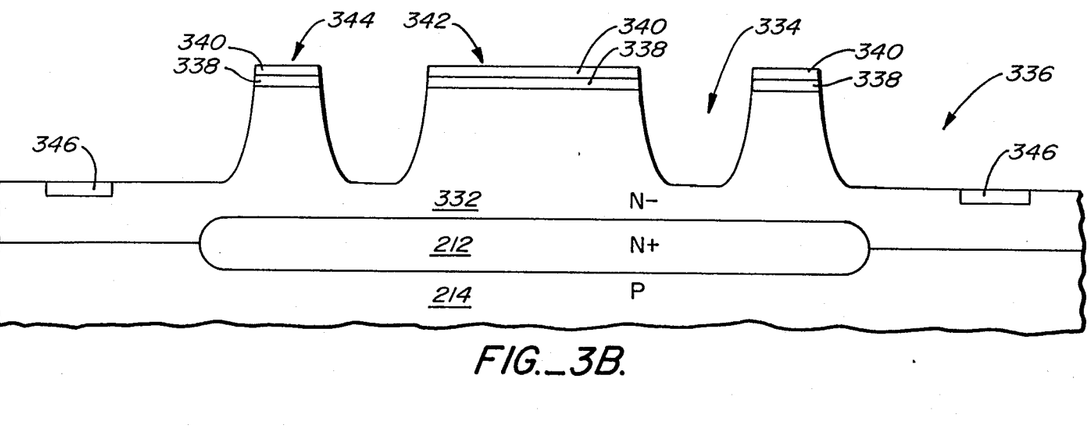

FIG. 3B shows the result of steps used to form apertures 334 and 336 in which inner field oxide 218 and outer field oxide 222 are to be formed respectively. A stress relief oxide layer 33, about 200–400 Å. thick is grown on epitaxial layer 332. Silicon nitride 340 is deposited over stress relief oxide layer 338 by low pressure chemical vapor deposition. The stress relief oxide layer 338 serves as a mechanical buffer between silicon nitride 340 and epitaxial layer 332, which have different thermal expansion coefficients. Apertures 334 and 336 are defined photo-lithograhpically, and a dry etch imposes the pattern through the silicon nitride 340, stress relief oxide layer 340 and a portion of epitaxial layer 332. Upon formation of apertures 334 and 336, stress relief oxide layer 338 and nitride 340 remain over a base/emitter region 342 and a collector insert region 344 of bipolar transistor 200.

FIG. 3B also shows the location of a boron implant 346 which provides the dopant used in channel stop 224. The structure of FIG. 3b is heated in oxygen to form a silicon dioxide coat everywhere there is silicon; no oxide forms over the silicon nitride. The locations for the channel stop boron implant 346 are defined photo-lithographically, and these locations are etched through the silicon dioxide layer to epitaxial layer 332. The wafer is inserted in an oven containing boron vapor which penetrates into epitaxial layer 332 to form the boron diffusion 346. During the next oxidation step, the wafer is heated to drive the boron to the ultimate location of channel stop 224, shown in FIGS. 2 and 3C.

Figure 3C:
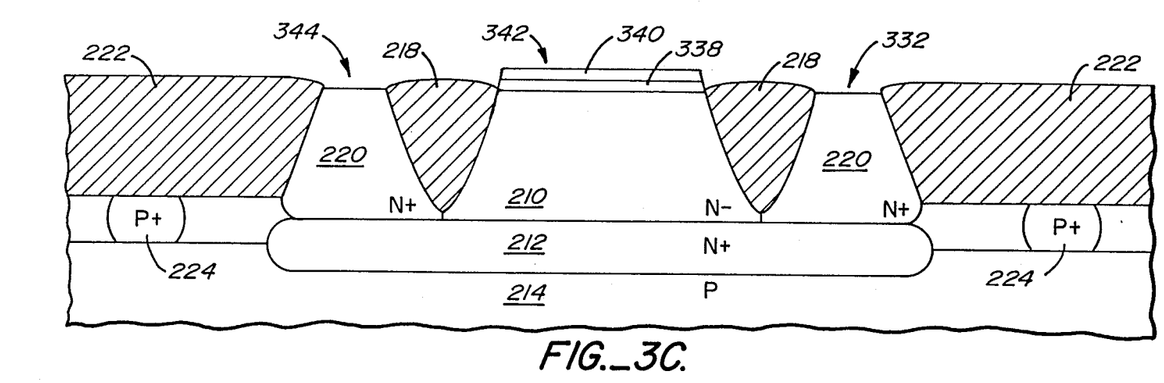
Figure 4:
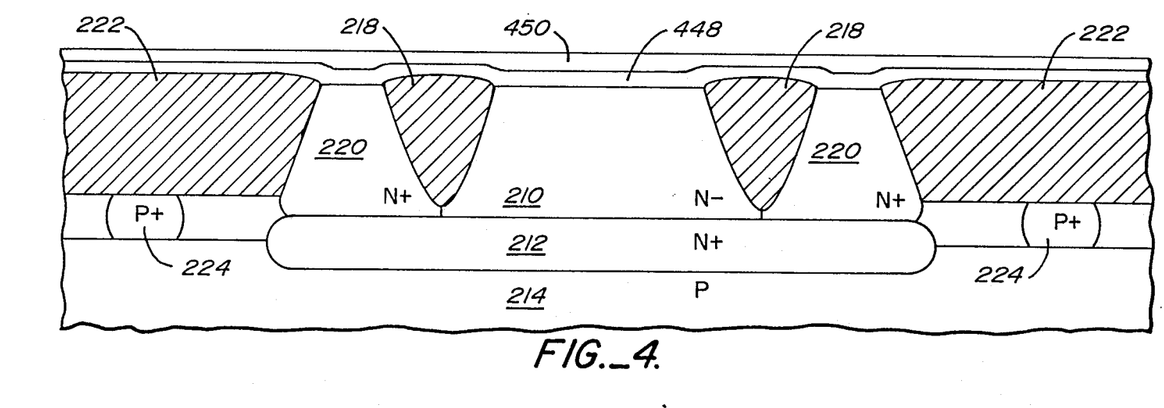
FIG. 4 is a sectional view of a bipolar transistor at the last illustrated stage of frabrication of the bipolar transistor of FIG. 2 before the process of fabrication significantly diverges from the process used to fabricate the bipolar transistor of FIG. 1.

FIG. 3C shows inner field oxide 218 and outer field oxide 222 in place. During the heating step used to diffuse boron to form channel stop 224, oxide is grown except where there is nitride 340. Nitride 340 over base/emitter region 342 is masked while nitride over the collector insert region 344 is etched away. The wafer is then put in a furnace with $POCl_3$ gas, the phosphorous of which diffuses into epitaxial layer 332 to define collector insert 220, yielding the structure of FIG. 4D. This structure is then dipped in hot phosphoric acid to remove nitride 340 over base/emitter region 342 and then dipped in hydrofluoric acid to remove the remaining stress relief oxide 338.

The structure of FIG. 4 differs from that of FIG. 3C in that the remaining nitride 340 and stress relief oxide 338 of FIG. 3C have been stripped and layers of polysilicon 448 and silicon nitride 450 have been added uniformly over the wafer. The steps represented in FIGS. 3A-C and FIG. 4 for fabricating bipolar transistor 200 of the present invention correspond closely to steps used to fabricate bipolar transistor 100 of the background art. The process for fabricating the preferred embodiment of the present invention is described further with reference to FIGS. 5A-D and 6A-B, while further steps in the background art are compared with reference to FIGS. 7A and B.

Figure 5A:
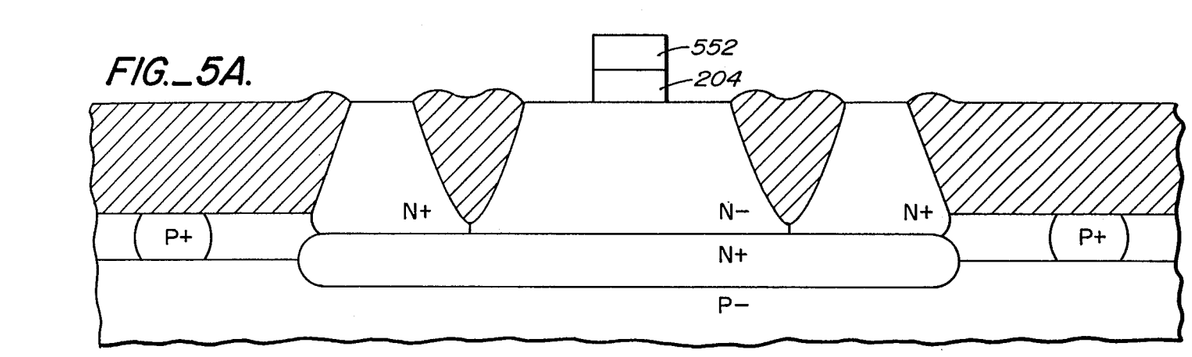
FIGS. 5A–D are sectional views of the bipolar transistor of FIG. 2 in stages of fabrication following the stage illustrated in FIG. 4.

The structure of FIG. 4 is masked and then etched in a plasma reactor to create the structure of FIG. 5A, including the polysilicon emitter contact pedestal 104 and a temporary cap of silicon nitride 552. The plasma reactor etch can be monitored using the reflections of a laser beam which can be used to indicate when the field oxides are exposed, and thus when the etch should be stopped.

Figure 5B:
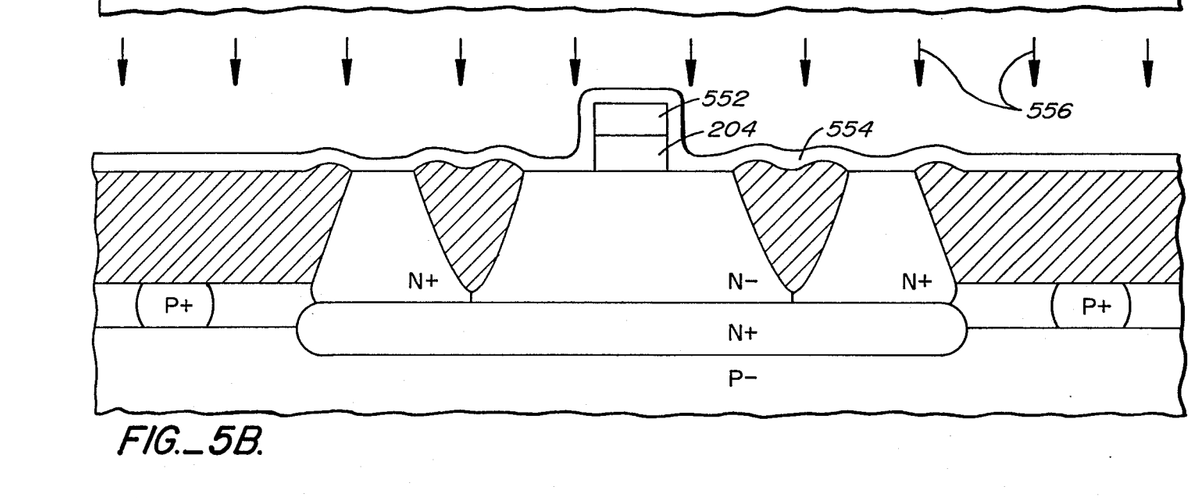
Figure 5C:
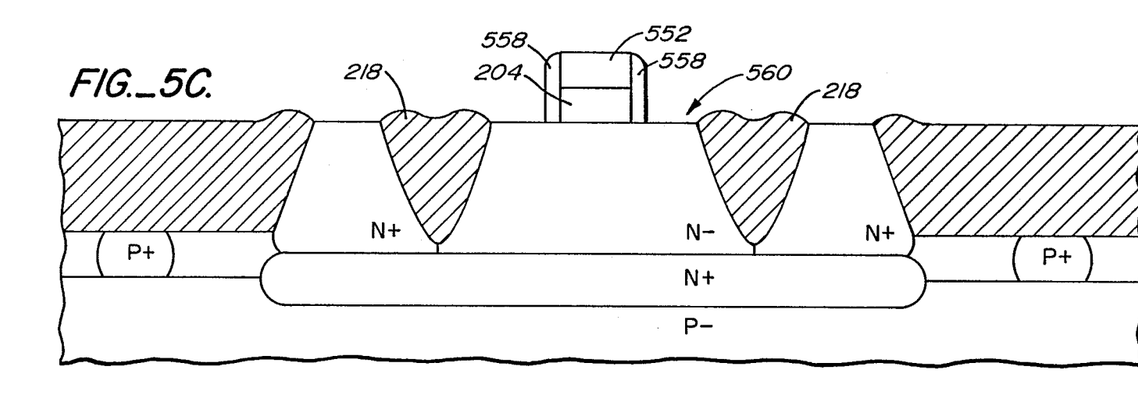

Over the structure of FIG. 5A, silicon dioxide 554 is deposited. Specifically, the wafer is placed in a furnace with oxygen and silane which react and coat the wafer with a uniform coat of silicon dioxide 554 to yield the structure of FIG. 5B. Arrows 556 of FIG. 5B depict the direction of a collimated etch in a reactor. Silicon dioxide 554 is etched uniformly in a downward direction so that a sidewall spacer 558 remains when the remaining silicon dioxide is etched away, yielding the structure of FIG. 5C.

Boron is implanted in a base insert region 560 between the sidewall spacer 558 and inner field oxide 218. In a subsequent annealing step, this boron diffuses both downward and laterally to from the p+base insert 216, shown in FIG. 5D. The eventual spacing of base insert 216 from emitter 206, yet to be formed, is determined by the width of sidewall spacer 558 as offset by lateral diffusion of the dopant defining base insert 216. Thus, the length d of the eventual base resistive path can be precisely controlled as a function of the thickness of sidewall spacer 558, which is basically the thickness of the deposition of silicon dioxide 554 of FIG. 5B. This is the key to the high frequency capabilities of the completed bipolar transistor 200.

Figure 5D:
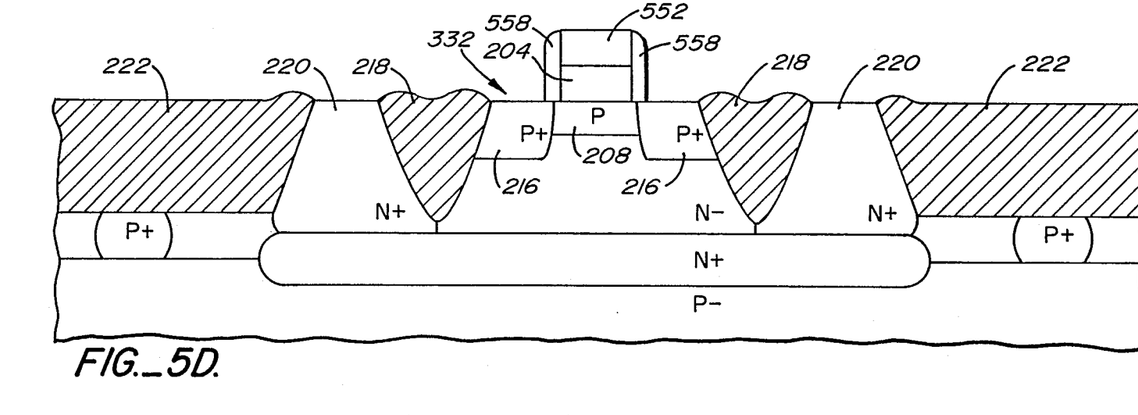

Without masking, boron penetrates over the entire wafer surface. Boron implanted in field oxides 218 and 222, shown in FIG. 5D, is inoperative, while boron implanted in collector insert 220 is dominated by the prevalent n+doping. Alternatively, masking can be used to protect collector insert 220 from boron doping. Boron also penetrates sidewall spacer 558, but this boron is disposed of when sidewall spacer 558 is later removed.

In addition, boron penetrates silicon nitride cap 552 and into pedestal 204. During the diffusion to form base insert 216, boron in pedestal 204 diffuses into epitaxial layer 332 to form base 208. The concentration of this diffusion can be controlled as a function of the thickness of nitride cap 552, since the thickness of the nitride controls the amount of boron deposited into emitter pedestal 204. Thus, lightly doped based 208 can be formed concurrently with the heavily doped base insert 216.

Figure 6A:
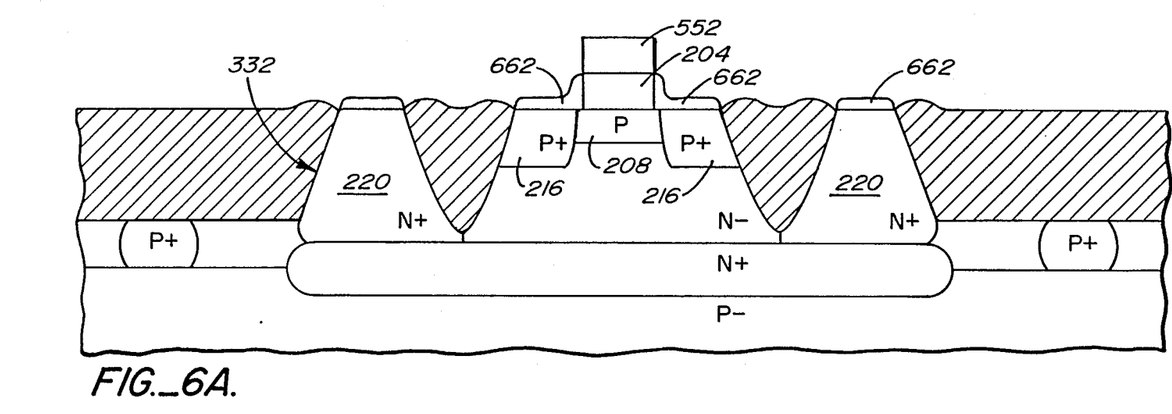
FIGS. 6A–B are sectional views of the bipolar transistor of FIG. 2 in stages of fabrication following those stages illustrated in FIGS. 5A-D.

FIG. 6A represents a stage after sidewall spacer 558 of FIG. 5D has been removed and a new layer of silicon dioxide 662 has been grown. Sidewall spacer 558 is removed using a chemical etch. Silicon dioxide 662 is grown where there is exposed silicon with which to interact, i.e., over base insert 216 and collector insert 220 and at the sidewall of pedestal 204. During the growth of this silicon dioxide 662, pedestal 204 laterally thins, slightly increasing its distance from base insert 216.

Figure 6B:
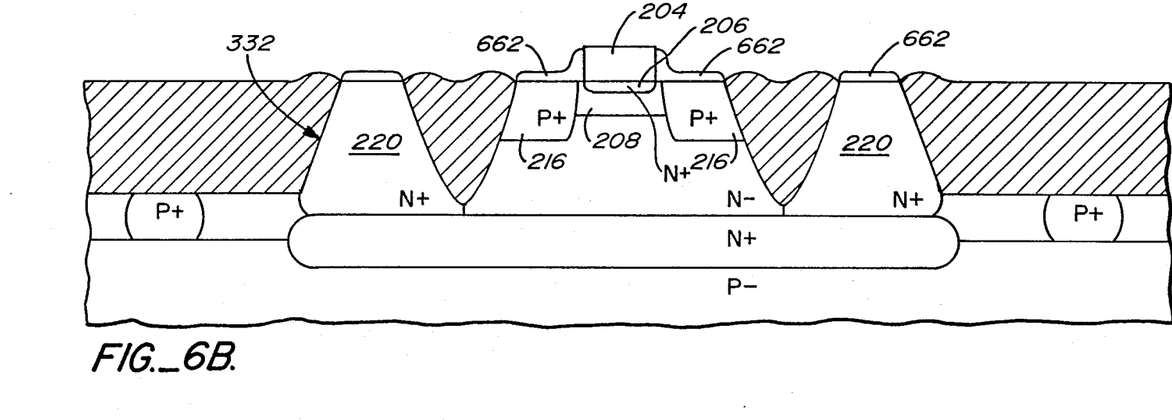

FIG. 6B introduces emitter 206. Nitride cap 552 of FIG. 6A is chemically etched off pedestal 204 with phosphoric acid. Arsenic is implanted into pedestal 204 and diffused into epitaxial layer 332 to form emitter 206. The portion of silicon dioxide 662 over base insert 216 protects the latter from the n-type arsenic dopant.

In an alternative embodiment of the present invention, a thicker nitride cap over an emitter contact pedestal substantially prevents boron from diffusing completely through the pedestal as a base insert is formed as described with reference to FIG. 5D. In this alternative embodiment, the p-type base (208) is absent from the structure corresponding to that illustrated in FIGS. 5D and 6A. After the nitride cap is removed, both arsenic and boron are implanted in the emitter contact pedestal and then diffused into the epitaxial layer. Since boron diffuses more rapidly than arsenic in silicon, the boron diffuses farther permitting the concurrent formation of the base and the emitter. The resulting structure is essentially the same as that depicted in FIG. 6B. An advantage of this approach is that the boron is excluded from the collector inserts. On the other hand, separate diffusions of boron and arsenic, as practiced in the illustrated embodiment, allow independent and thus more precise control of the diffusion profiles of base 208 and emitter 206.

Bipolar transistor 200 of FIG. 2 is obtained from the structure of FIG. 6B as follows. Silicon dioxide 662 of FIG. 6B is isotropically etched until it is removed completely. Sidewall spacer 216 is formed using a silicon dioxide deposition followed by a collimated etch. A refractory metal such as titanium is deposited over the structure. When annealed, the titanium forms a silicide where it contacts silicon, while the unreacted titanium can be removed by chemical etch. Titanium silicide is highly conductive and functions effectively as contact material over the emitter contact pedestal, base insert and collector insert.

Due to the small dimensions achievable using the method the present invention, the surface area of base insert 216 can be less than ideal for the formation of a contact. Accordingly, and prior to the annealing step just mentioned, amorphous silicon is deposited onto the titanium in a photo-lithographically defined pattern over portions of the inner and outer field oxides 218 and 222. After annealing and removal of unreacted titanium, titaniumsilicide serving as a base contact 228 extends over a portion of inner field oxide 218. Similarly, titanium silicide serving as the collector contact 230 insert extends over the outer field oxide 222. As is apparent in FIG. 2, this allows more area for base and collector contacts 228 and 230. Metallic contacts for the base and collector currents can thus be more freely spaced from the metal contact carrying an emitter current. The deposition of amorphous silicon can be omitted where the contact enlargement is not required.

Figure 7A:
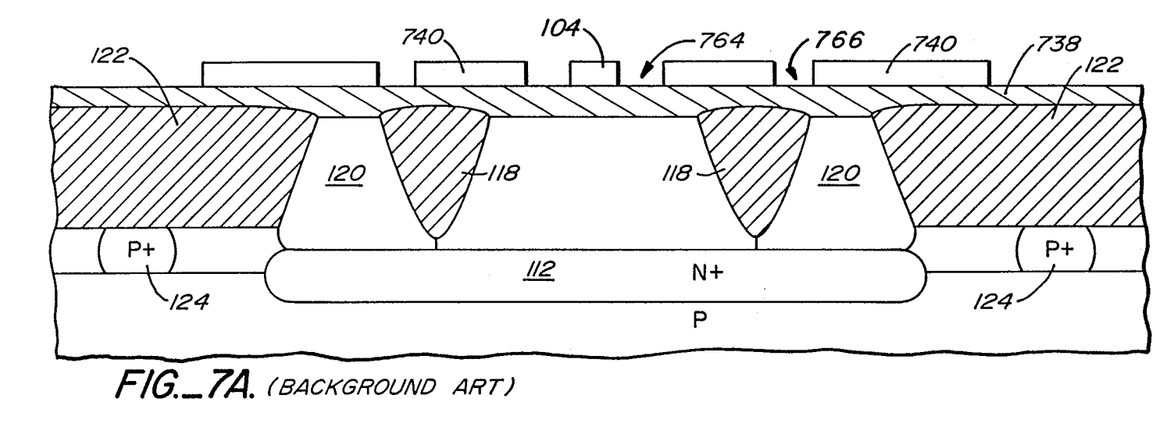
FIGS. 7A–B are sectional views of the bipolar transistor of FIG. 1 of the background art in stages of fabrication following the stage corresponding to that illustrated in FIG. 4.
Figure 7B:
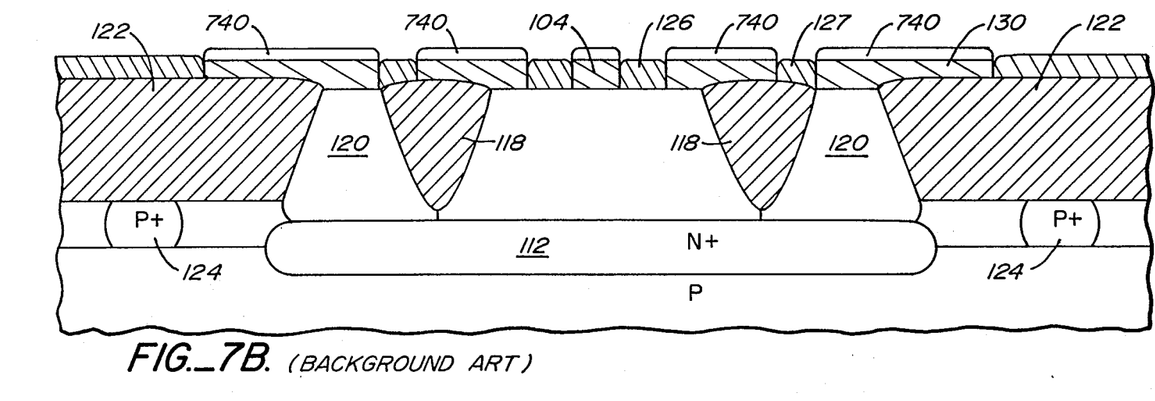

The present invention's advantage in reducing base current resistive path length can be understood in a comparison to the process of the background art, further detailed in FIGS. 7A and 7B. FIG. 7A follows the last common step of the fabrication process shown in FIG. 4. Instead of defining only an emitter contact pedestal, photo-lithography is used to define an inner isolation aperture 764 and an outer isolation aperture 766, which in turn delimit emitter contact pedestal 104, base contact 128, and collector contact 130, shown in FIG. 7B. The minimum widths of apertures 764 and 766, in which oxide isolations are to be formed, are defined essentially by the resolution of the photo-lithographic process employed. In particular, aperture 764 is formed by etching a layer of silicon nitride 740 (corresponding to element 552 in FIG. 5A). The minimum width of this aperture 764 is essentially the minimum gap size definable in resist using photo-lithography. In a 1 μm photo-lithographic process, the minimum aperture width is 1 μm.

FIG. 7B shows oxide isolations 126 and 127 after they are grown on the exposed polysilicon by heating the structure of FIG. 7A in a furnace containing oxygen. Oxide isolation 126 separates emitter contact pedestal 104 and base insert contact 120, as shown in FIG. 1. The width of oxide isolation 126 determines the distance between emitter contact pedestal 104 and base contact 116. The resistive path of the base current can be made less than 1 μm due to lateral diffusion of the boron in region of base insert 116. However, it is difficult to maintain the required isolation between base insert 116 and emitter 106 is if this distance D is less than 0.7 μm, shown in FIG. 1. By steps corresponding to those of FIGS. 5C, 5D, 6A, 6B and 2, bipolar transistor 100 of the background art can be completed starting with the structure of FIG. 7b.

Contrasting the present invention with the background art as illustrated in FIG. 1, FIG. 7A shows a photo-lithographically limited minimum width for an isolation aperture 764 in nitride 740. This in turn places a lower bound on the base current resistive path length D. Practically, in a 1 μm process, this path length is at least about 0.7 μm. The present invention defines an oxide isolation as a function of an oxide deposition 554, of FIG. 5B. Such a deposition can be made reliable with dimensions much smaller than the 200 nm used in the bipolar transistor 200. Thus, the oxide isolation of the present invention is not process limited, except insofar as fabrication tolerances require conservatism to prevent shorting.

The present invention provides for a range of variations from the disclosed embodiments. The steps leading upt to the formation of the emitter contact pedestal or following the formation of the base insert are subject to different sequences. Furthermore, the details of the completed device need not be maintained in all embodiments. For example, the nature of the collector can be varied. In many respect ths sequencing of steps can be changed. For example, the base can be formed before, during or after the formation of the base inserts. Formation of the base inserts can also occur before, during or after formation of the base inserts. Essential steps of the present invention need not be successive. A sidewall spacer need not be formed right after the emitter contact pedestal is formed and the base insert need not be formed immediately after the sidewalls are formed.

The sidewall spacer used to define the base insert may or may not be present in the completed bipolar transistor. These and other variations and modifications are provided for by the present invention, the scope of which is defined only by the following claims.

What is claimed is:

1. A method of fabricating a bipolar transistor comprising the steps of:
    forming a collector as a heavily doped buried layer on a silicon substrate covered with an epitaxial silicon layer;
    defining inner and outer field oxide regions with a collector insert region therebetween, said inner field oxide region separating said collector insert region from a base-emitter region;
    forming channel stops around said collector, said channel stops being heavily doped and having a conductivity opposite that of said collector;
    forming silicon dioxide in said inner and outer field oxide regions;
    doping said collector insert region to form a collector insert extending to said collector, said collector insert being heavily doped and having the same conductivity type as said collector;
    photo-lithographically defining a polysilicon pedestal with a silicon nitride cap on a top surface thereof over an emitter subregion of said base-emitter region, said pedestal having a wall surface extending generally orthogonal to said substrate;
    depositing silicon dioxide and performing a collimating etch thereof to define sidewall spacers on said pedetal;
    implanting base insert dopant of conductivity opposite that of said collector and diffusing it to form a base insert region between said emitter subregion and said inner field oxide region;
    implanting base dopant of conductivity type opposite that of said collector into said emitter contact pedestal and diffusing it into said epitaxial silicon layer to define a base for said bipolar transistor, and
    implanting dopant of conductivity type the same as that of said collector into said emitter contact pedestal and diffusing it into said epitaxial layer to a lesser extent than said base dopant so that an emitter is defined for said bipolar transistor.

2. The method of claim 1 wherein said step of implanting and diffusing base dopant is concurrent with said step of implanting and diffusing said base insert dopant.

3. The method of claim 1 wherein said step of implanting and diffusing said base dopant is concurrent with said step of implanting and diffusing said emitter dopant.

4. The method of claim 1 further comprising a step of forming silicide contacts over said collector insert, said base insert and said emitter contact pedestal.

* * * * *

UNITED STATES PATENT AND TRADEMARK OFFICE
CERTIFICATE OF CORRECTION

PATENT NO. : 4,857,476

DATED : August 15, 1989

INVENTOR(S) : Jean-Pierre Colinge

It is certified that error appears in the above-identified patent and that said Letters Patent is hereby corrected as shown below:

Column 1, line 10, "A major object" should read -- A major objective --

Column 3, line 48, "Fig. 1, bopolar" should read -- Fig. 1, bipolar --

Column 3, line 62, "transistor 200 beings with" should read -- transistor 200 begins with --

Column 6, line 51, "titaniumsilicide serving" should read -- titanium silicide serving --

Column 7, line 45, "ing upt to the" should read -- ing up to the --

Column 7, line 50, "respect ths sequencing" should read -- respect the sequencing --

Column 8, line 33, "pedetal;" should read -- pedestal; --

Signed and Sealed this

First Day of January, 1991

*Attest:*

HARRY F. MANBECK, JR.

*Attesting Officer*  *Commissioner of Patents and Trademarks*